United States Patent [19]
Labude et al.

[11] 3,846,732
[45] Nov. 5, 1974

[54] TUNER HOUSING WITH CONTACT BRIDGE MEANS

[75] Inventors: Wolfgang Labude; Karl-Heinz Bauer, both of Bad Neustadt, Germany

[73] Assignee: FA."PREH. Elektrofeinmechanische Werke, Jakob PREH, NACHF", Bad Neustadt/Saale, Germany

[22] Filed: Oct. 12, 1973

[21] Appl. No.: 405,785

[52] U.S. Cl. .................. 338/133, 339/17 LM, 334/7
[51] Int. Cl. .............................................. H01c 9/02
[58] Field of Search ............................ 338/128–131, 338/133; 334/1, 2, 6, 7, 52, 86; 317/10 R, 10 CB, 120; 339/17 L, 17 LC, 17 LM, 17 M

[56] References Cited

UNITED STATES PATENTS 3,439,292 4/1969 Henry .................................... 334/7
3,585,560 6/1971 Schlesier ............................ 338/131
3,708,618 1/1973 Hofmeister .................. 317/101 CB
3,792,387 2/1974 Arrington ........................... 338/129

*Primary Examiner*—Robert K. Schaeffer
*Assistant Examiner*—Gerald P. Tolin
*Attorney, Agent, or Firm*—Edmund M. Jaskiewicz

[57] ABSTRACT

A storage unit houses a tuner and comprises a drawer which is slidable from the receiver. A plurality of control knobs are on the longitudinal side walls of the drawer and rotate shafts which move sliders along electrical resistances on an insulator wall mounted within the housing. A printed circuit which has conductors thereon is spaced from the insulator wall and a plurality of electrical contacts of resilient material are detachably mounted on the printed circuit board to connect the conductors thereon through contact bridge elements to the shafts or to conductors on the insulator wall.

12 Claims, 7 Drawing Figures

TUNER HOUSING WITH CONTACT BRIDGE MEANS

The present invention relates to a storage unit or housing for a tuner for radio and television receivers, more particularly, to the mounting and electrical connecting of a plurality of control knobs to electrical circuit elements within the housing.

Radio and television receivers have generally been provided with built-in tuning units wherein the controls for selecting the range of frequency in radios and for switching and tuning of the channels in television receivers were all combined into a single component. The increasing use of remote control units for switching of television channels resulted in the tuner being further subdivided into its functional components. In the usual arrangement, the switches for the channels are arranged as keys in a keyboard in a position comfortable and favorable to the television viewer while the controls used for the tuning of the channels and for selection of frequency ranges which are less commonly used are located in a position spaced from the location of the channel switches at the convenience of the receiver manufacturer.

In order to occupy the minimum amount of area on the front face of radio and television receivers the channel tuning and the range selection controls have been arranged in a housing constructed as a drawer and slidably mounted in the receiver. The adjusting controls for channel tuning and switches for selection of ranges of frequency were located on the upper surface of the drawer. For tuning of the channels, electrical resistors were employed wherein the moving contact was actuated by spindle shafts positioned in parallel to the direction of sliding of the drawer in the receiver. As a result, the number of channels desired to be incorporated in the tuner determined the width of the drawer. In the event the channels exceeded a certain number, difficulties were encountered both with respect to the electrical cable connections and with respect to the mechanical mounting and guiding of the drawer in the receiver. Further, the increase of width in the drawer was limited since in general sufficient area for widened drawers was not available.

It is therefore the principal object of the present invention to provide a novel and improved storage unit or housing for a tuner for a radio and television receivers.

It is another object of the present invention to provide such a housing which requires a very small area on the front face of the receiver yet enables a greater number of channel tuning controls to be mounted therein.

It is a further object of the present invention to provide such a housing which is relatively inexpensive to manufacture, is simple in construction and is easy to operate.

It is an additional object of the present invention to provide such a housing which occupies a minimum of space but which has the control knobs arranged thereon in such a manner as to avoid unintentional touching or operation of the knobs.

According to one aspect of the present invention a housing for a tuner for radio and television receivers may comprise an elongated enclosure having longitudinal side walls and which is mounted as a drawer in the receiver. A plurality of control knobs are provided along each of the side walls and are operatively connected to spindle shafts which are positioned in aligned pairs with the ends of the shafts of a pair facing each other. Rotation of the control knobs cause sliders to move on the spindle shafts along electrical resistance elements mounted on an insulator wall spaced from the shafts. Conductor paths on a printed circuit board spaced from the insulator wall are connected to conductor paths on the insulator wall or to the spindle shafts by means of resilient elements which are detachably connected to contact bridges.

Other objects and advantages of the present invention will be apparent upon reference to the accompanying description when taken in conjunction with the following drawings, which are exemplary, wherein.

Proceeding next to the drawings wherein like reference symbols indicate the same parts throughout the various views a specific embodiment of the present invention will be described in detail.

Figure 1:
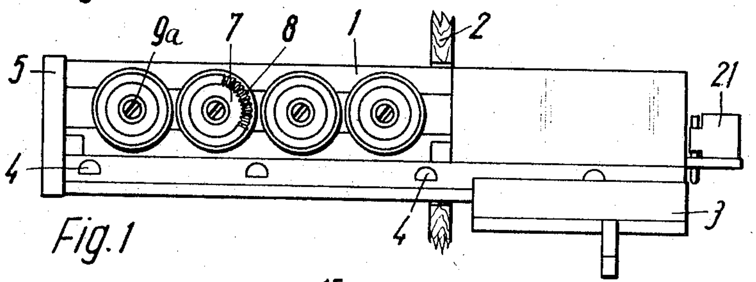
FIG. 1 is a side elevational view of a storage unit for a tuner according to the present invention with the storage unit being in the form of a drawer and shown in a withdrawn position with respect to the receiver.

As may be seen in FIG. 1, a storage unit or housing 1 of plastic material is constructed as a drawer which can be pulled from a frame 2 of a radio or television receiver to an end stop position as illustrated. A suitable locking or stopping mechanism which is not shown in the drawing is located on the lower side of the housing 1. The locking mechanism comprises a component 3 which can be seen in FIG. 1 and this component is attached to the receiver. A plate which is not shown in the drawings is guided in the component 3. The plate is snapped into openings formed in the walls of the housing and the stop device is located on the plate.

A plate cover 5 which may perform a decorative function is mounted in T-shaped slot 6 formed on the front wall of the housing and is attached to the housing by means of known snap fasteners. The outer face of the cover plate 5 may have a color or design to harmonize with the face of the specific receiver.

A plurality of rotary control knobs 7 are located on both of the relatively narrow longitudinal side walls of the housing 1. The knobs 7 are employed for tuning of channels and for selecting the range of frequency. The knobs are provided with a knurled or groved edge 8 to facilitate gripping of the knobs with the fingers. The outer surface of the knob is provided with a slot 9*a* into which a screwdriver may be inserted. In order to tune a particular channel the control knob 7 can be rotated since the knob can be connected directly or through a coupling to a spindle shaft 9. A slider 10 to which a spring can be connected is displaceably mounted on the spindle shaft 9 so as to be moveable along the shaft in response to the rotation of the shaft. A slide spring 11 is connected to the slider 10 and provides an electrical connection between the resistance layer on an insulator wall, to be presently described, and the spindle shaft 9. The slider 10 thus functions as a moveable contact with respect to an electrical resistance.

In order to select a particular range of frequency, the control knob can be pressed inwardly and can be coupled to a plastic coupling element, not shown in the drawings. A pointer 12 is molded onto the coupling element. The rotary control knob can then be rotated into a position corresponding to the number of the frequency range.

A cover plate 13, which itself may be transparent, is mounted within the housing 1 above the pointer 12. The cover plate may be provided with transparent fields 14 containing various scales of indicia such as the ranges of frequency. Slots 15 which are parallel to the respective shafts 9 are provided in the housing and an indicator finger 16 projects through the slots so that each indicator is moveable wih its respective slider 10. Various scales or other data or information may also be provided laterally along the cover plate 13.

Figure 3:
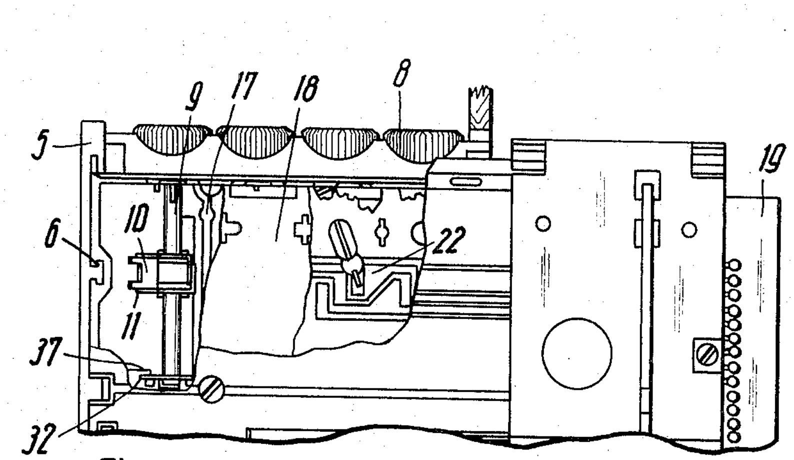
FIG. 3 is a bottom plan view of a portion of the storage unit of FIG. 1 with portions being cut away.
Figure 2:
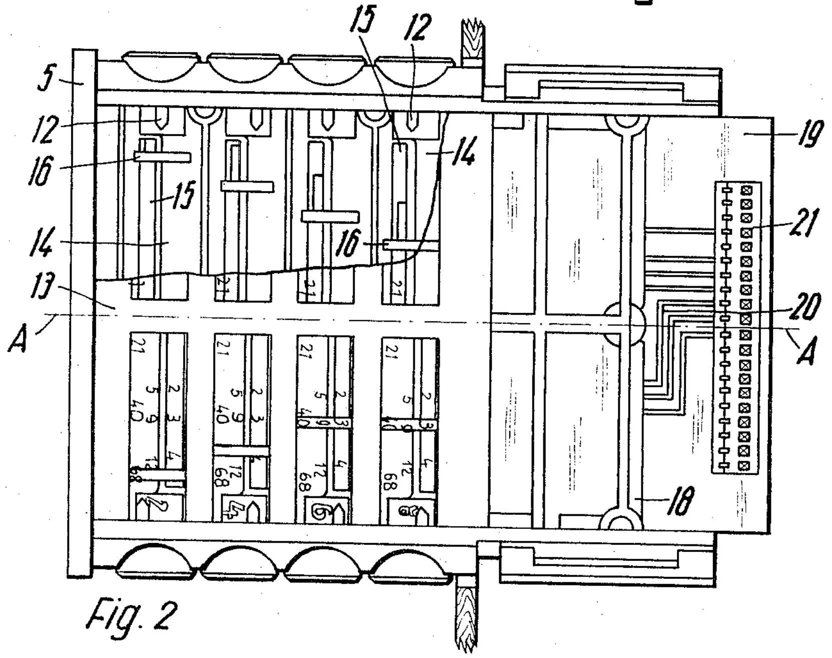
FIG. 2 is a top plan view of the storage unit of FIG. 1 with portions thereof being cut away.

As can be seen in FIG. 3 the housing 1 can be provided with a plurality of integral reenforcing ribs 17 which separate the adjacent channel units from each other. The housing 1 may be molded from a suitable synthetic plastic material and the ribs 17 molded to be integral therewith. A wall 18 of electrically insulating material is positioned as can be seen in FIG. 2 and comprises electrical resistance layers thereon, which are not shown, which are electrically connected by suitable conductor paths or strips known in the art and similarly not shown.

A printed circuit plate 19 is mounted below the insulator wall 18 in the housing 1 and comprises a plurality of conductor paths 20 on both sides of the board 19 as known in the art. Only a few of these conductors paths 20 on a side of the printed circuit board 19 are shown in FIG. 2 on the right side thereof. The conductor paths lead to a terminal block 21 which comprises a plurality of connections by means of which the conductor paths 20 are connected by wires to the suitable electronic components. The printed circuit board 19 also has a number of switching devices 22 for the selection of the range of frequency, as may be seen in FIG. 3.

Figure 6:
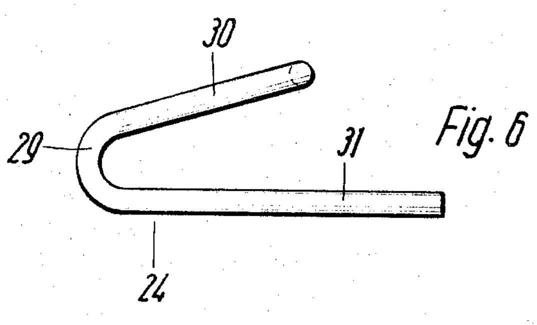
FIG. 6 is a side elevation view of a contact element in enlarged scale.
Figure 5:
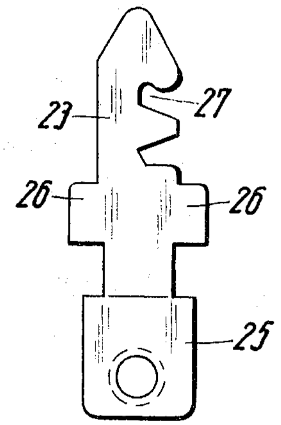
FIG. 5 is a plan view of a contact bridge in enlarged scale.
Figure 7:
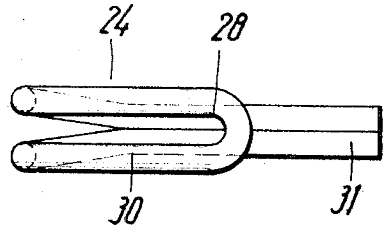
FIG. 7 is a top plan view of the contact element of the FIG. 6.

An electrical connection between the conductor paths on the insulator wall 18 and the conductor paths on the printed circuit 19 is established by means of a contact bridge 23 (see FIG. 5) and a resilient contact element 24 shown in FIGS. 6 and 7. The contact bridge 23 is punched from a metal strip and has a lower portion 25 which is bent at a 90° angle after the punching operation. This lower portion is then attached to the insulator wall 18 by means of a rivet. Upon assembly of the storage unit, the printed circuit board 19 will rest upon shoulders 26 on the contact bridge 23. At one end of the contact bridge there is formed a notch or recess 27 which extends obliquely upwardly to approximately the center of the contact bridge.

Figure 4:
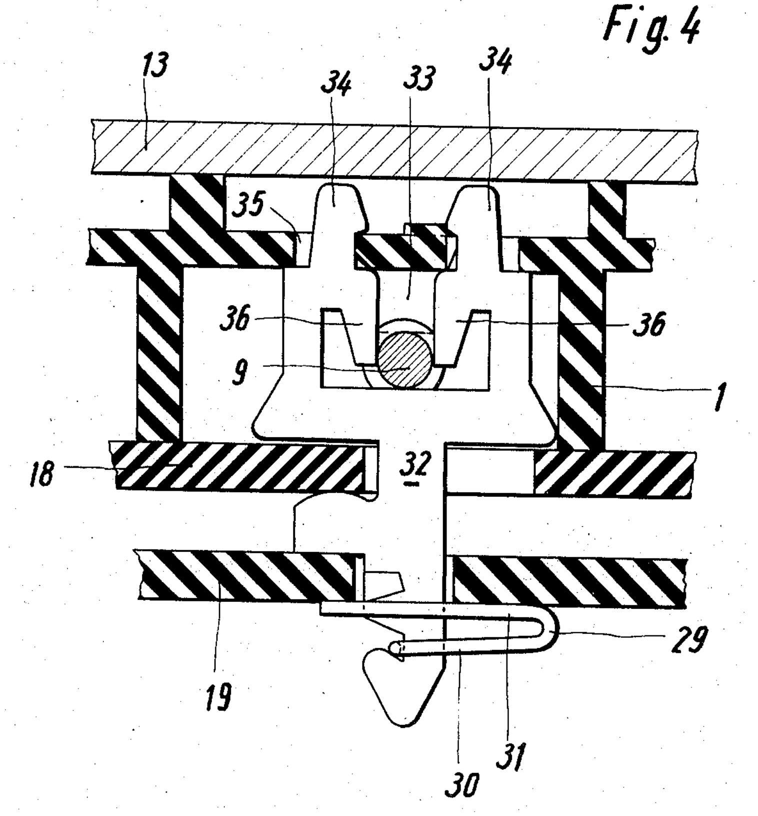
FIG. 4 is a sectional view through a portion of the storage unit in enlarged scale and showing the contact element and contact bridge.

The contact element 24 comprises spring wire which is bent initially into a looped portion 28 enclosing an acute angle and subsequently bent again to produce a further bend 29 comprising an acute angle so that when the contact element is viewed from the side, as in FIG. 6, the element has a U-shape. The loop 28 thus forms a first arm 30 which is received under tension in notch 27 as can be seen in FIG. 4. The remaining portion of the contact element comprises a second arm 31 formed by the open ends of the spring wire which ends are in contact under tension with the conductor paths on the printed circuit board 19 to establish the electrical connection. The contact bridge 23 is positioned between the two side portions of the contact element as viewed in FIG. 7.

The contact element 24 may also be used in connection with a contact bridge 32 shown in FIG. 4 the upper half portion of which corresponds to that of the contact bridge 23. The lower end portion of contact bridge 32 is formed with a longitudinal slot 33 to receive the spindle shaft 9 from below in the upward direction. The lower ends of the arms define slot 33 and are indicated at 34 and are provided with locking projections that engage corresponding locking slots formed in the housing 1. The upper ends of the arms are formed with spring tongs 36 which are so formed to engage resiliently the spindle shaft 9. In order that the contact bridge 32 is firmly secured in position the bridge is locked between two guide projections 37 molded into the housing as shown in FIG. 3.

In the embodiment of the invention as described herein the storage unit or housing is constructed as a drawer which is slidably withdrawn from the receiver to enable the viewer or listener to tune the channels or frequency ranges. However, in accordance with the present invention the storage unit can also be pivoted from the receiver. Other elements of the receiver which are employed to adjust further characteristics or properties of the receiver can then be positioned behind the storage unit within the receiver.

Thus it can be seen that the present invention has disclosed a storage unit for the tuner for a radio or television receiver which can be constructed either as a drawer or as a unit which is pivotable from the receiver. Further, the arrangement of the control knobs on the unit and the spindle shaft actuated by the control knobs is such that the entire tuner occupies a minimum of space while providing a wide range of tuning options.

It will be understood that this invention is susceptible to modification in order to adapt it to different usages and conditions, and accordingly, it is desired to comprehend such modifications within this invention as may fall within the scope of the appended claims.

What is claimed is:

1. A housing for a tuner for radio and television receivers comprising an elongated enclosure having longitudinal side walls, a plurality of control knobs along each of said side walls, a rotatable spindle shaft extending from each of said knobs and the shafts arranged in aligned pairs with the inner ends of the shafts of a pair facing each other, sliders moveable along said shafts in response to rotation thereof, an insulator wall adjacent to said shafts and extending over said enclosure, electrical resistance means on said insulator wall and traversed by said sliders for the tuning of capacitance of diodes, a plurality of electrical conducting paths on said insulator wall electrically connecting said electrical resistance means thereon, a printed circuit board having a plurality of electrical conducting paths thereon spaced from said insulator wall, a plurality of electrical contact elements of resilient electrically conducting material detachably mounted on said printed circuit board and electrically connected to the conducting paths thereon, and contact bridge means of electrically conducting material electrically connecting said contact elements to the electrical conducting paths on said insulator wall.

2. A housing for a tuner as claimed in claim 1 wherein said contact bridge means has a notch therein, said contact element being U-shaped and having first and second arms, said first arm being engagable with said contact bridge means notch and said second arm resiliently contacting a conductor path on said printed circuit board.

3. A housing for a tuner as claimed in claim 2 wherein said contact element comprises spring wire and said first arm comprises a U-shaped portion and said second arm comprises the ends of the wire such that said contact bridge means is disposed within said U-shaped portion and between the two leg portions of said arms.

4. A housing for a tuner as claimed in claim 1 wherein said contact bridge means comprises a flat metallic body.

5. A housing for a tuner as claimed in claim 1 wherein said enclosure comprises a plurality of reenforcing ribs integral with said enclosure and positioned between said shafts to define a plurality of compartments for said tuner shafts and the components associated therewith.

6. A housing for a tuner as claimed in claim 1 wherein there is a slot in said housing for each of said shafts and parallel to the respective shaft, and an indicator pointer extending from each of said sliders through the respective slots.

7. A housing for a tuner as claimed in claim 1 and an index pointer responsive to the rotation of a control knob to indicate the range of tuning by that control knob.

8. A housing for a tuner as claimed in claim 7 wherein there is a slot in said housing for each of said shafts and parallel to the respective shaft, an indicator pointer extending from each of said sliders through the respective slots, and a transparent cover plate mounted within said enclosure to cover said index and indicator pointers, there being indicia scales on said cover plate with which said pointers coact.

9. A housing for a tuner as claimed in claim 1 wherein said enclosure comprises a drawer adapted to be slidably mounted within the receiver, and means on said drawer for stopping said drawer at a predetermined position when withdrawn from the receiver.

10. A housing for a tuner as claimed in claim 1 wherein said enclosure is pivotally mounted within the receiver so as to be pivotable therefrom to provide access to the control knobs.

11. A housing for a tuner as claimed in claim 1 and means within the receiver behind said enclosure for adjusting further the receiver.

12. A housing for a tuner for radio and television receivers comprising an elongated enclosure having longitudinal side walls, a plurality of control knobs along each of said side walls, a rotatable spindle shaft extending from each of said knobs and the shafts arranged in aligned paris with the inner ends of the shafts of a pair facing each other, sliders moveable along said shafts in response to rotation thereof, an insulator wall adjacent to said shafts and extending over said enclosure, electrical resistance means on said insulator wall and traversed by said sliders for the tuning of capacitance of diodes, a plurality of electrical conducting paths on said insulator wall electrically connecting said electrical resistance means thereon, a printed circuit board having a plurality of electrical conducting paths thereon spaced from said insulator wall, a plurality of electrical contact elements of resilient electrically conducting material detachably mounted on said printed circuit board and electrically connected to the conducting paths thereon, and contact bridge means of electrically conducting material electrically connecting said contact elements to said shafts.

* * * * *